United States Patent [19]

Takahashi et al.

[11] Patent Number: 5,528,545
[45] Date of Patent: Jun. 18, 1996

[54] SEMICONDUCTOR MEMORY DEVICE

[75] Inventors: Jun Takahashi; Tomohisa Wada, both of Hyogo, Japan

[73] Assignee: Mitsubishi Denki Kabushiki Kaisha, Tokyo, Japan

[21] Appl. No.: 369,758

[22] Filed: Jan. 6, 1995

[30] Foreign Application Priority Data

Jan. 6, 1994 [JP] Japan .................................. 6-000317

[51] Int. Cl.$^6$ ..................................................... G11C 7/06
[52] U.S. Cl. ........................... 365/208; 365/207; 327/53; 327/51
[58] Field of Search ................................... 365/208, 207, 365/196, 190; 327/51, 52, 53

[56] References Cited

U.S. PATENT DOCUMENTS

| | | | |
|---|---|---|---|
| 4,697,112 | 9/1987 | Ohtani et al. | 327/53 |
| 4,713,797 | 12/1987 | Morton et al. | 327/53 |
| 5,055,720 | 10/1991 | Tiede | 327/53 |
| 5,130,580 | 7/1992 | Min et al. | 327/53 |
| 5,280,441 | 1/1994 | Wada et al. | 365/63 |
| 5,321,659 | 6/1994 | Taguchi | 365/208 |

FOREIGN PATENT DOCUMENTS 4-228188  8/1992  Japan .

OTHER PUBLICATIONS

"Current–Mode Techniques For High–Speed VLSI Circuits with Application To Current Sense Amplifier For CMOS SRAM's", E. Seevinck, IEEE Journal of Solid–State Circuits, vol. 26, No. 4 Apr. 1991.

Primary Examiner—Tan T. Nguyen
Attorney, Agent, or Firm—Lowe, Price, LeBlanc & Becker

[57] ABSTRACT

A semiconductor memory device includes a plurality of sense amplifiers for amplifying current changes which occur in corresponding bit line pairs in accordance with binary signals stored in activated memory cells. Each of the sense amplifiers includes first and second current mirror circuits for generating currents of the magnitudes respectively corresponding to currents flowing through a corresponding bit line pair, a storing circuit, responsive to a signal selecting a memory cell, for storing the currents generated by the first and second current mirror circuits before activation of the memory cell, or a difference between these currents, and a current supplying circuit, responsive to activation of the memory cell and based on the amount stored in the storing circuit, for supplying, to the first and second current mirror circuits, currents having a predetermined relationship with the currents having been generated by the first and second current mirror circuits before activation of the memory cell. A current change corresponding to data stored in the selected memory cell and not affected by an offset occurs in a connection node between the first current mirror circuit and the current supplying circuit, or a connection node between the second current mirror circuit and the current supplying circuit.

18 Claims, 15 Drawing Sheets

FIG.7
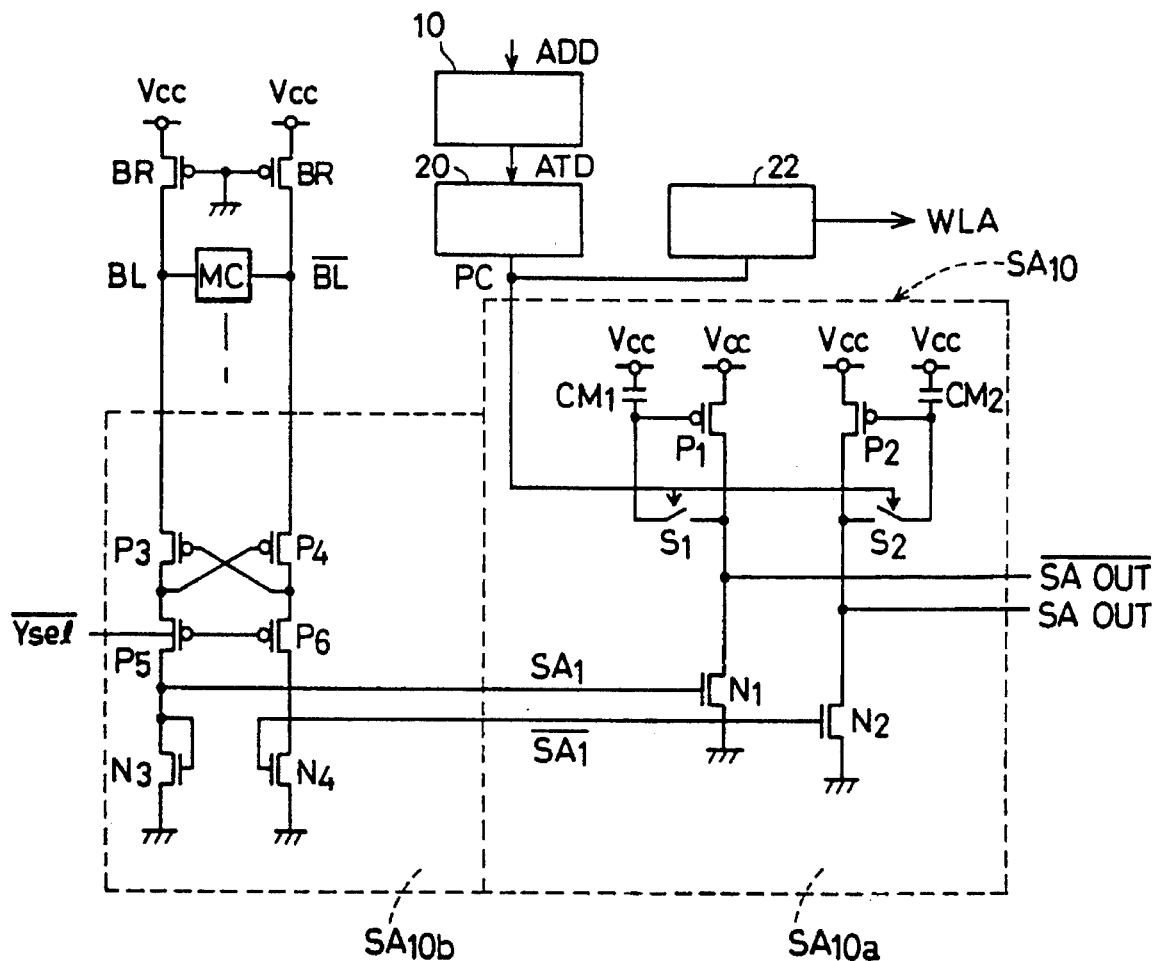
FIG. 8(A)
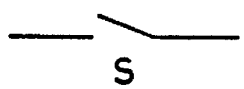
FIG. 8(B)
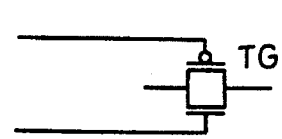

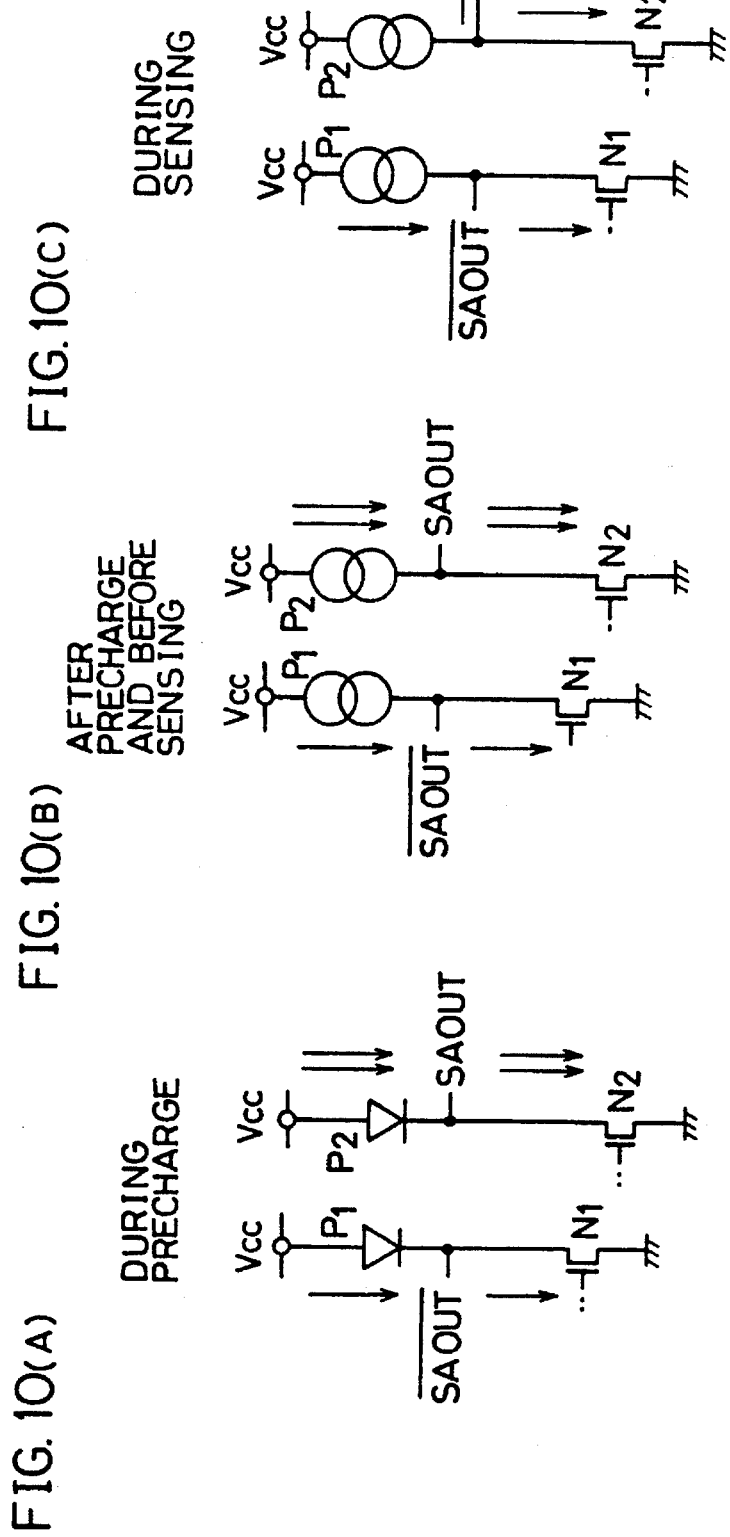

SEMICONDUCTOR MEMORY DEVICE

BACKGROUND OF THE INVENTION

1. Field of the Invention

The present invention generally relates to semiconductor memory devices, and more particularly, to a semiconductor memory device including a sense amplifier of a current mode technique detecting a current flowing through a bit line and sensing data stored in a memory (hereinafter simply referred to as a "current sensing technique").

2. Description of the Background Art

Referring to FIG. 1, a conventional static random access memory (hereinafter referred to as an "SRAM") 200 includes a plurality of memory cells MC arranged in the row and column directions, a plurality of word lines provided corresponding to rows, and a plurality of bit line pairs BL and $\overline{BL}$ provided corresponding to columns. SRAM 200 further includes a row decoder RD connected to the ends of the plurality of word lines WL, and a column selector CS connected to the ends of the plurality of bit line pairs BL and $\overline{BL}$. SRAM 200 further includes a plurality of sense amplifiers SA30 provided corresponding to the plurality of bit line pairs BL and $\overline{BL}$ through column selector CS, and a plurality of bit line loads BR connected to the other ends of the plurality of bit line pairs BL and $\overline{BL}$.

Referring to FIGS. 2A and 2B, memory cell MC of SRAM 200 shown in FIG. 1 includes driver transistors 51a, 51b, access transistors 52a, 52b, load resistances 53a, 53b, and storage nodes 54a, 54b.

Driver transistor 51a has its drain connected to storage node 54a, its gate connected to storage node 54b, and its source grounded. Driver transistor 51b has its drain connected to storage node 54b, its gate connected to storage node 54a, and its source grounded.

Access transistor 52a has its source connected to storage node 54a, its drain connected to bit line BL, and its gate connected to word line WL. Access transistor 52b has its source connected to storage node 54b, its drain connected to bit line $\overline{BL}$, and its gate connected to word line WL.

Load resistance 53a has one end connected to power supply potential Vcc, and the other end connected to storage node 54a. Load resistance 53b has one end connected to power supply potential Vcc, and the other end connected to storage node 54b.

SRAM 200 operates as follows. In response to an externally applied column address signal, a column decoder, not shown, drives column selector CS to connect bit line pair BL and $\overline{BL}$ and sense amplifier SA30 for a corresponding column. A constant bias current $I_B$ limited by bit line load BR flows through each of bit lines BL and $\overline{BL}$ connected to sense amplifier SA30. In response to an externally applied row address signal, row decoder RD brings the potential of word line WL of a corresponding row to a selected level (H level), and activates a plurality of memory cells MC connected to the row.

Memory cell MC selected by the column address signal and the row address signal operates as follows. Referring to FIG. 2B, assume that storage node 54a of memory cell MC is at the H level, and that storage node 54b is at an L level. At this time, driver transistor 51a of memory cell MC is in a non-conductive state, and driver transistor 51b is in a conductive state. In addition, since word line WL is at the H level, access transistors 52a and 52b of memory cell MC are both in a conductive state. Therefore, a cell current $I_C$ flows to ground from bit line $\overline{BL}$ via access transistor 52b and driver transistor 51b. Since driver transistor 51a is in a non-conductive state, however, a current does not flow through another path, that is, a path from bit line BL to ground via access transistor 52a and driver transistor 51a.

More specifically, when the potentials of storage nodes 54a and 54b of selected memory cell MC are at the H level and the L level, respectively, a direct current $I_B$ flows into sense amplifier SA30 from bit line BL. In addition, a direct current $I_B$–$I_C$ flows into sense amplifier SA30 from bit line $\overline{BL}$. Similarly, when the potentials of storage nodes 54a and 54b of selected memory cell MC are at the L level and the H level, respectively, the direct current $I_B$–$I_C$ flows into sense amplifier SA30 from bit line BL. The direct current $I_B$ flows into sense amplifier SA30 from bit line $\overline{BL}$.

Sense amplifier SA30 amplifies the current difference between bit lines BL and $\overline{BL}$. A binary signal written in selected memory cell MC thus appears at the output of sense amplifier SA30.

FIG. 3 is a circuit diagram showing a configuration of sense amplifier SA30 of SRAM 200 shown in FIG. 1, which is described in "Current-mode techniques for high speed VLSI circuit", IEEE JSSC vol. 26, No. 4, April, 1991, by Seevinck et al.

Referring to FIG. 3, sense amplifier SA30 includes a differential amplifying portion SA30a and a current transferring portion SA30b. Differential amplifying portion SA30a includes a current mirror circuit formed of P channel MOS transistors P1 and P2, and a differential input circuit formed of N channel MOS transistors N1 and N2.

P channel MOS transistor P1 and N channel MOS transistor N1 have their drains connected to each other. The source of P channel MOS transistor P1 is connected to power supply potential Vcc. The source of N channel MOS transistor N1 is grounded. P channel MOS transistor P2 and N channel MOS transistor N2 have their drains connected to each other through an output node SA OUT. The source of P channel MOS transistor P2 is connected to power supply potential Vcc. The source of N channel MOS transistor N2 is grounded. P channel MOS transistor P1 and P channel MOS transistor P2 have their gate electrodes connected together to the drain of P channel MOS transistor P1.

Current transferring portion SA30b includes P channel MOS transistors P3, P4, P5 and P6, N channel MOS transistors N3 and N4, and nodes SA1 and $\overline{SA1}$.

P channel MOS transistors P3 and P5, node SA1, and N channel MOS transistor N3 are connected in series between one end of bit line BL and ground. P channel MOS transistors P4 and P6, node $\overline{SA1}$, and N channel MOS transistor N4 are connected in series between one end of bit line $\overline{BL}$ and ground. The gate of P channel MOS transistor P3 is connected to the drain of P channel MOS transistor P4. The gate of P channel MOS transistor P4 is connected to the drain of P channel MOS transistor P3.

N channel MOS transistors N3 and N4 form current mirror circuits together with N channel MOS transistors N1 and N2 of differential amplifying portion SA30a, respectively. More specifically, the gates of N channel MOS transistors N3 and N1 are connected together to node SA1. The gates of N channel MOS transistors N4 and N2 are connected together to node $\overline{SA1}$. P channel MOS transistors P5 and P6, also serving as a transfer gate of column select or CS, are controlled by a $\overline{Ysel}$ signal from a column decoder (not shown).

Referring to FIG. 3, driver transistor 51a of selector memory cell MC is rendered conductive to one end of bit line load BR and the source of P channel MOS transistor P3 through bit line BL having a parasitic resistance Rb and a parasitic capacitance Cb. Driver transistor 51b is rendered conductive to one end of bit line load BR and the sources of P channel MOS transistors P3 and P4 through bit line $\overline{BL}$ having parasitic resistance Rb and parasitic capacitance Cb. The other ends of bit line loads BR and $\overline{BR}$ are both connected to power supply potential Vcc.

Sense amplifier SA30 operates as follows. FIG. 4 is a circuit diagram of a related portion during reading of data from memory cell MC having storage node 54a at the H level (hereinafter referred to as "H reading"). FIG. 4 is referred to for explanation of currents on bit lines BL and $\overline{BL}$ and the potentials of respective nodes of current transferring portion SA30b of sense amplifier SA30.

Assume that the potential of storage node 54a of memory cell MC is at the H level. When the memory cell MC is activated, and $\overline{Ysel}$ signal (cf. FIG. 3) is brought to a selected level (ground level), P channel MOS transistors P5 and P6 are rendered conductive. The cell current $I_C$ flows into memory cell MC from bit line $\overline{BL}$. The direct current $I_B$-$I_C$ flows through transistors P4, P6 and N4. The cell current $I_C$ does not flow into memory cell MC from bit line BL. The direct current $I_B$ flows through transistors P3, P5 and N3. It is assumed that P channel MOS transistors P3, P4, P5 and P6 are all equal-sized, and that they operate in saturation.

P channel MOS transistors P3 and P5 are equal-sized, connected in series, and both operate in saturation. The gate-to-source voltage of P channel MOS transistor P3 is usually equal to the gate-to-source voltage of P channel MOS transistor P5. The gate-to-source voltage is represented by V1. The same applies to P channel MOS transistors P4 and P6. The common gate-to-source voltage of P channel MOS transistors P4 and P6 is represented by V2.

Referring to FIG. 4, the potentials of the ends of bit lines BL and $\overline{BL}$ on the sense amplifier side are represented by V (BL) and V ($\overline{BL}$). Consider these values. Since P channel MOS transistors P3 and P4 are cross-coupled, the potential V (BL) and the potential V ($\overline{BL}$) are both V1+ V2. The potential V (BL) and the potential V ($\overline{BL}$) are equal independent of whether a current flowing into a transistor pair of P channel MOS transistors P3 and P5 and a current flowing into a transistor pair of P channel MOS transistors P4 and P6 are equal or not. More specifically, the ends of bit lines BL and $\overline{BL}$ can be considered to be virtually short-circuited, although not connected to each other actually. A current change on bit line pair BL and $\overline{BL}$ which occurs when memory cell MC is activated is immediately transmitted to N channel MOS transistors N3 and N4 without charging/discharging bit line capacitance Cb, and further transferred to differential amplifying portion SA30a (cf. FIG. 3) through nodes SA1 and $\overline{SA1}$.

As shown in FIG. 3, N channel MOS transistors N3 and N1, N channel MOS transistors N4 and N2, and P channel MOS transistors P1 and P2 respectively form current mirror circuits. P channel MOS transistor P1 and N channel MOS transistor N1 are connected in series. Therefore, the direct current $I_B$ flows through transistors P1 and P2, and N1 and N3. The direct current $I_B$-$I_C$ flows through transistors N2 and N4. The cell current $I_C$ is provided from output node SA OUT.

The case of H reading was described above. The same applies to the case of reading of data from memory cell MC having storage node 54a at the L level (hereinafter referred to as "L reading"). In the case of L reading, a current "$-I_C$" is provided from output node SA OUT. Therefore, by knowing the output of sense amplifier SA30, a binary signal written in memory cell MC can be read out.

However, such SRAM 200 as described above has three problems. The first problem is an offset caused by variation of transistors P1-P6 and N1-N4 configuring sense amplifier SA30. The second problem is arrangement of sense amplifiers SA30. The third problem is a parasitic resistance of bit lines BL and $\overline{BL}$.

Consider the offset of sense amplifier SA30 generated due to variation of transistors P1-P6 and N1-N4. The characteristics of transistors P1-P6 and N1-N4 configuring sense amplifier SA30 usually vary due to variation of the manufacturing process and the like. More specifically, the dimension of transistors P1-P6 and N1-N4 differs from a predetermined value due to variation of the manufacturing process and the like. As a result, a driving ability of transistors P1-P6 and N1-N4 may deviate from a design value, or the electrical characteristics such as a threshold voltage of transistors P1-P6 and N1-N4 may deviate from a predetermined value.

Such a case is equivalent to the case where a voltage source or current source having a magnitude corresponding to an offset voltage value or current value is connected to sense amplifier SA30. Consider, for example, the case where, due to variation of characteristics of transistors P3-P6, N3 and N4, a direct current flowing through transistors P4, P6 and N4 becomes larger than that flowing through transistors P3, P5 and N3 in FIG. 4. This case is equivalent to the case where an offset current source 55 having a magnitude corresponding to an offset current $I_L$ is connected between input nodes of ideal current transferring circuit SA30b, as shown in FIG. 5. Therefore, even if the potentials of storage nodes in a memory cell are equal to each other, the output of a sense amplifier is offset in one direction by this offset amount.

For a signal of a polarity opposite to the offset, it can be considered that the sensitivity of the sense amplifier is reduced by this offset amount. In the example of FIG. 5, it can be considered that the sensitivity of the sense amplifier for H reading is reduced. The reduction of sensitivity causes increase in a time required for sensing of data. In the worst case, it becomes impossible to sense data.

As described before with reference to FIG. 5, when the potentials of storage nodes in memory cell MC are equal before access to memory cell MC, if the offset current $I_L$ is 0, a current $I_{P3}$ flowing through the transistor pair of P3 and P5, and a current $I_{P4}$ flowing through the transistor pair of P4 and P6 are both $I_B$. However, if the value of the offset current $I_L$ becomes $I_C/2$, the currents $I_{P3}$ and $I_{P4}$ are as follows:

$$I_{P3}= I_B-I_L= I_B-I_C/2$$

$$I_{P4}= I_B+I_L= I_B+I_C/2$$

Therefore, when the cell current $I_C$ is 0, the current difference $I_{P4}$-$I_{P3}$ between these currents is:

$$I_{P4}-I_{P3}=(I_B+I_C/2)-(I_B-I_C/2)=I_C$$

In this case, as shown in FIG. 4, assume that data is stored in memory cell MC, and that the cell current $I_C$ was generated. Even if the current $I_{P4}$ flowing through the transistor pair of P4 and P6 is decreased by the cell current $I_C$, no detectable difference between $I_{P3}$ and $I_{P4}$ occurs. Therefore, data stored in memory cell MC cannot be sensed.

Further, in SRAM 200 having a plurality of sense amplifiers SA30 as shown in FIG. 1, different sense amplifiers SA30 often require different times for sensing data due to variation in the manufacturing process. Taking into consideration such reduction of the sensitivity of the sense amplifier and variation of times required for sensing of a current difference, the magnitude of an input signal of sense amplifier SA30 (more specifically, an amplitude of a signal on a bit line) must be made larger than necessary.

Description will now be given of the second problem associated with arrangement of sense amplifiers SA. When the capacity of SRAM 200 becomes larger, and the pitch (in this specification, the "pitch" refers to a distance between the centers of things of the same kind arranged at a constant interval) of bit lines BL and $\overline{BL}$ becomes smaller accordingly, it becomes difficult to arrange one sense amplifier SA30 for every bit line pair BL and $\overline{BL}$. Therefore, an SRAM 300 configured as shown in FIG. 6 can be more easily implemented, in which a plurality of bit line pairs BL and $\overline{BL}$ share one sense amplifier SA30.

Referring to FIG. 6, in SRAM 300, a plurality of bit line pairs BL and $\overline{BL}$ are connected together to a common input/output line pair I/O and $\overline{I/O}$ through corresponding transfer gates TG provided in column selector CS. Sense amplifier SA30 is connected to the common input/output line pair I/O and $\overline{I/O}$. In SRAM 300, a plurality of bit lines BL and $\overline{BL}$ share one bit line load BR, which is connected to common input/output lines I/O and $\overline{I/O}$.

However, SRAM 300 involves the following problems. In the example described with reference to FIG. 3, transistor P5 or P6 of current transferring portion SA30b of sense amplifier SA30 was used as a transfer gate of column selector CS. However, in SRAM 300 of FIG. 6, transistor P5 or P6 in sense amplifier SA30 cannot be used as transfer gate TG of column selector CS. Therefore, SRAM 300 requires in column selector CS more transfer gates TG than the case of SRAM 200 of FIG. 3. Further, the parasitic resistance of the transfer gates TG is added to bit line pair BL and $\overline{BL}$.

Description will be given of the third problem associated with the bit line parasitic resistance. As described before, in a memory of a current sensing technique, a delay of a sensing time does not increase even if bit line capacitance Cb is increased, since bit line pair BL and $\overline{BL}$ is virtually short-circuited. By using this advantage, it seems that an SRAM including less sense amplifiers SA30 can be implemented with bit line pair BL and $\overline{BL}$ of a large capacitance. However, if a bit line is made longer simply for this purpose, the parasitic resistance Rb of the bit line itself is also increased simultaneously with increase in the bit line capacitance Cb. A time constant of bit line pair BL and $\overline{BL}$ itself becomes larger. Therefore, no matter how an amplitude of a signal is narrowed down at the ends of bit line pair BL and $\overline{BL}$ on the sense amplifier SA30 side in order to increase operation of the device in speed, the effects are insignificant.

SUMMARY OF THE INVENTION

One object of the present invention is to provide a semiconductor memory device which can read precisely a binary signal of a memory cell even if there is an offset current between a bit line pair.

Another object of the present invention is to provide a semiconductor memory device which can read precisely a binary signal of a memory cell even if there is an offset current between a bit line pair, and which can easily arrange a bit line peripheral circuit such as a sense amplifier even if its capacity is larger.

Still another object of the present invention is to provide a semiconductor memory device which can read precisely a binary signal of a memory cell even if there is an offset current between a bit line pair, can easily arrange a bit line peripheral circuit such as a sense amplifier even if its capacity is larger, and which can suppress increase in a parasitic resistance of a bit line.

A semiconductor memory device according to the present invention includes a memory cell array including a plurality of memory cells arranged in a plurality of rows and columns, a plurality of word lines provided corresponding to memory cell rows, a plurality of bit line pairs provided corresponding to memory cell columns, and a plurality of sense amplifiers provided corresponding to the plurality of bit line pairs for amplifying a current change which occurs in a corresponding bit line pair in accordance with a binary signal stored in a memory cell activated by a corresponding one of the word lines. Each of the sense amplifiers includes first and second current mirror circuits for generating currents of the magnitudes respectively corresponding to currents flowing through a corresponding one of the bit line pairs, a storing circuit, responsive to a signal selecting the memory cell, for storing an amount associated with currents generated by the first and second current mirror circuits before activation of the memory cell, and a current supplying circuit, responsive to activation of the memory cell and based on the amount stored in the storing circuit, for supplying, to the first and second current mirror circuits, currents having a predetermined relationship with the currents having been generated by the first and second current mirror circuits before activation of the memory cell, whereby a current change corresponding to data stored in the selected memory cell occurs in a connection node between the first current mirror circuit and the current supplying circuit, or in a connection node between the second current mirror circuit and the current supplying circuit. Currents before reading are temporarily stored in the storing circuit, and a difference between the stored current amount and the supplied current amount is detected at the time of reading. Even if there is an offset in currents flowing through the bit line pair when data is read out from the memory cell, data can be read out independent of such an offset because of the effect of the reading operation as described above. Since it is possible to carry out precise reading even with small currents flowing through the bit line pair, power consumption is decreased, and reading speed is increased.

In one aspect of the present invention, the semiconductor memory device further includes a circuit for generating and applying to the storing circuit a timing signal defining a timing at which the amount is stored in the storing circuit in response to the signal selecting a memory cell. Since a timing at which the amount is stored in the storing circuit is defined in accordance with the signal selecting a memory cell, the amount immediately before reading is precisely stored in the storing circuit. Therefore, precise reading can be expected.

In another aspect of the present invention, the storing circuit includes first and second current storing circuits for storing currents flowing through the first and second current mirror circuits, respectively. The storing circuit further includes a difference current storing circuit for storing a difference between the currents flowing through the first and second current mirror circuits.

According to still another aspect of the present invention, the semiconductor memory device includes a memory cell array including a plurality of memory cells arranged in a plurality of rows and columns, a plurality of word lines provided corresponding to memory cell rows, a plurality of bit line pairs provided corresponding to memory cell columns, a plurality of input/output line pairs provided crossing the plurality of bit line pairs and corresponding to the same, and connected to a corresponding one of the plurality of bit line pairs, and a plurality of sense amplifiers provided corresponding to the plurality of input/output line pairs for amplifying current changes which occur in a corresponding bit line pair and a corresponding input/output line pair in accordance with a binary signal stored in a memory cell activated by a corresponding one of the word lines. Each of the sense amplifiers includes first and second current mirror circuits for generating currents of the magnitudes respectively corresponding to currents flowing through a corresponding input/output line pair, a storing circuit, responsive to a signal selecting a memory cell, for storing an amount associated with the currents generated by the first and second current mirror circuits before activation of the memory cell, and a current supplying circuit, responsive to activation of the memory cell and based on the amount stored in the storing circuit, for supplying, to the first and second current mirror circuits, currents having a predetermined relationship with the currents having been generated by the first and second current mirror circuits before activation of the memory cell, whereby a current change corresponding to data stored in the selected memory cell occurs in a connection node between the first current mirror circuit and the current supplying circuit, or in a connection node between the second current mirror circuit and the current supplying circuit. Currents before reading are temporarily stored in the storing circuit, and a difference between the stored current amount and the supplied current amount is detected at the time of reading. Even if there is an offset in currents flowing through the bit line pair when data is read out from the memory cell, data can be read out independent of such an offset because of the effect of the reading operation as described above. Since it is possible to carry out precise reading even with small currents flowing through the bit line pair, power consumption is decreased, and reading speed is increased. Since the sense amplifier is connected to the bit line pair at the input/output line pair in the direction crossing the bit line pair, the sense amplifier and the other peripheral circuits can be easily arranged even if the capacity of the semiconductor memory device is larger, and the pitch of the bit line pair is smaller.

According to a further aspect of the present invention, the semiconductor memory device includes a plurality of memory cell arrays. The plurality of input/output line pairs are provided corresponding to the plurality of bit line pairs included in one memory cell array, and connected to a corresponding one of the plurality of bit line pairs of each of the plurality of memory cell arrays. As a result, the capacity of the semiconductor memory device can be further increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram showing a configuration of a sense amplifier of an SRAM according to a first embodiment of the present invention.

FIGS. 8(a)–8(b) is a diagram showing a specific configuration of a switch of the sense amplifier shown in FIG. 7.

FIGS. 10(a)–10(c) is a diagram for explaining operation of the sense amplifier shown in FIG. 7.

DESCRIPTION OF THE PREFERRED EMBODIMENTS

[First Embodiment]

Figure 1:
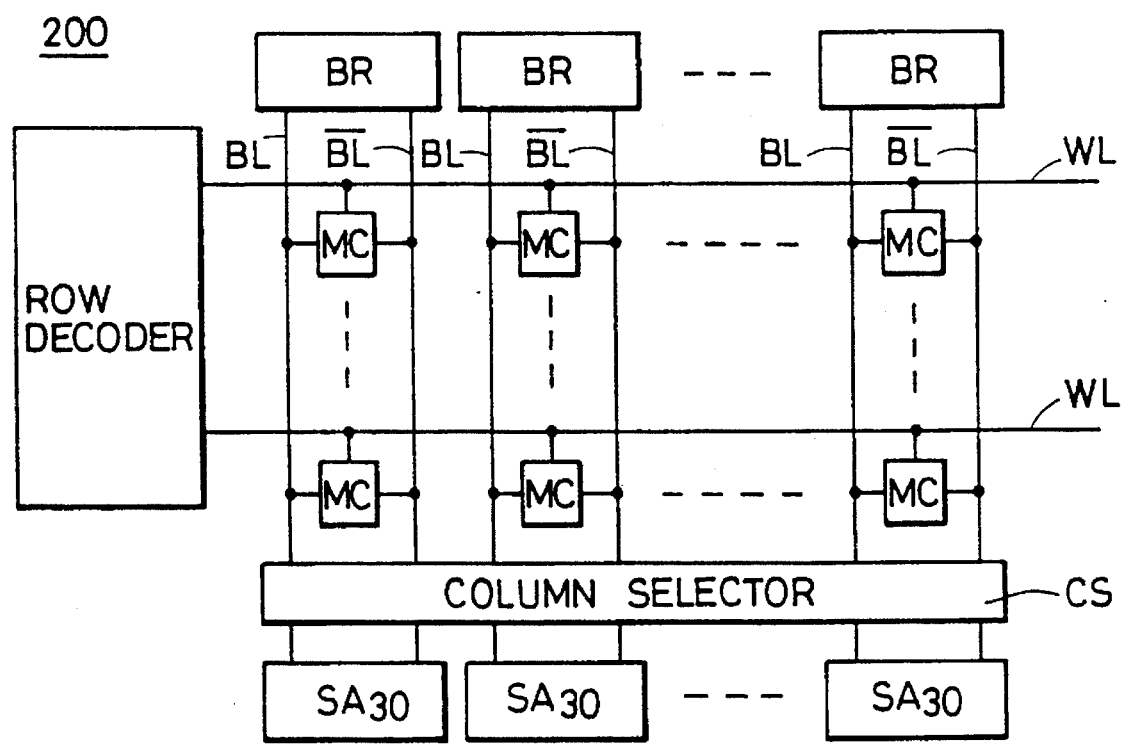
FIG. 1 is a block diagram showing a configuration of a conventional SRAM.
Figure 2A:
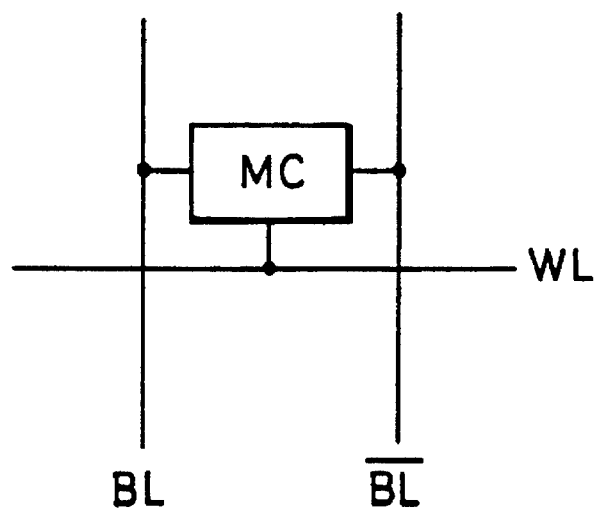
FIGS. 2(a)–2(b) is a circuit diagram showing a configuration of a memory cell of the SRAM shown in FIG. 1.
Figure 2B:
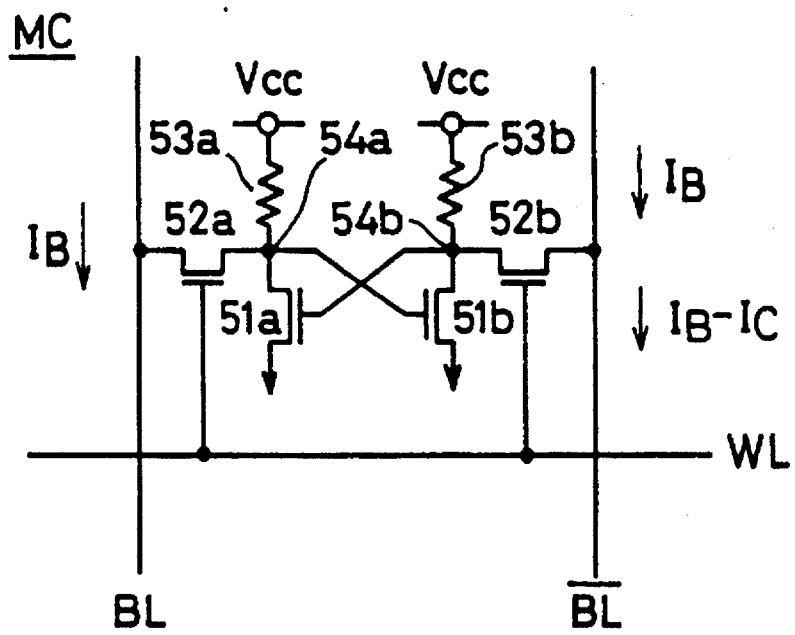
Figure 3:
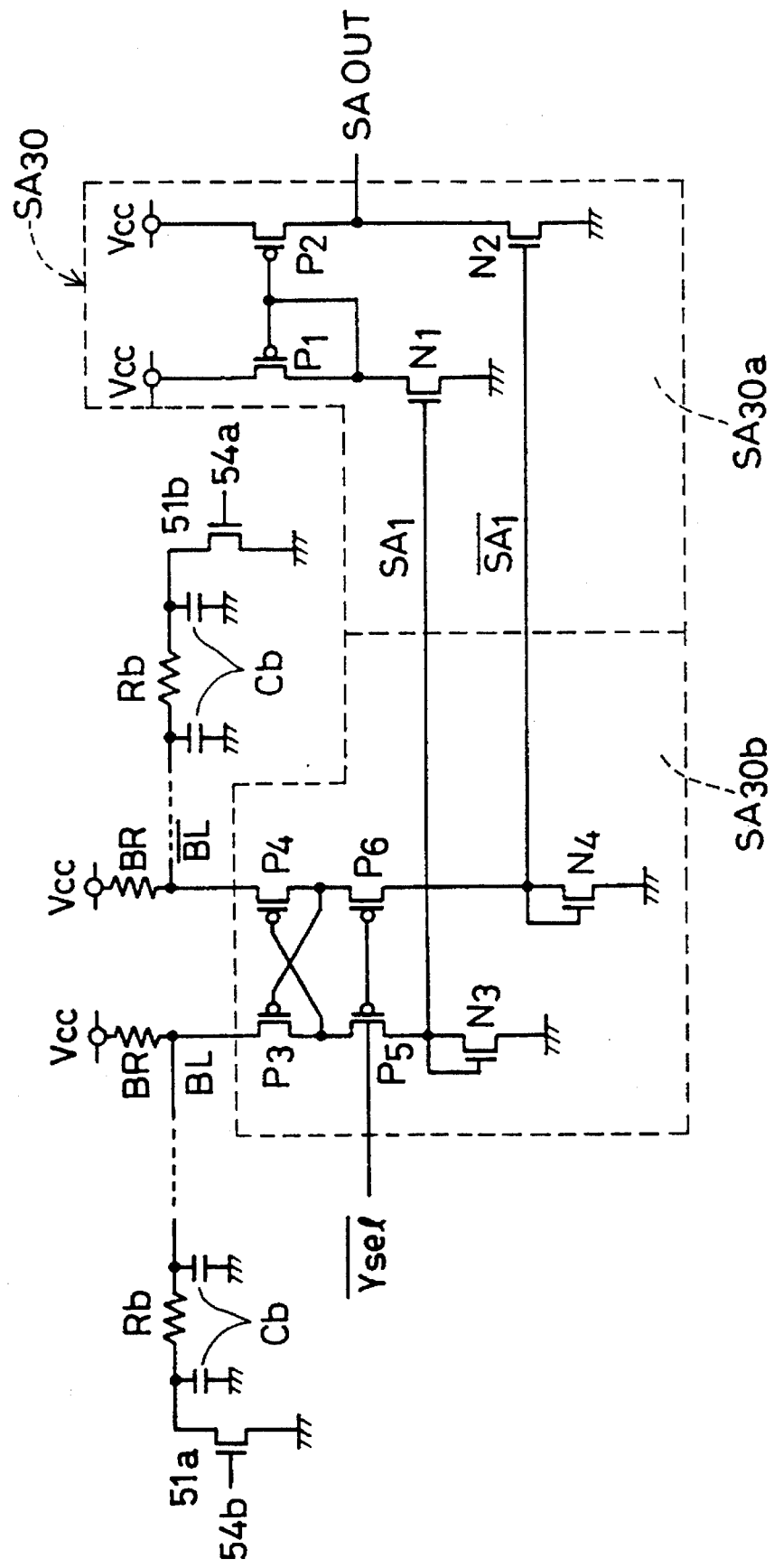
FIG. 3 is a circuit diagram showing a configuration of a sense amplifier of the SRAM shown in FIG. 1.
Figure 4:
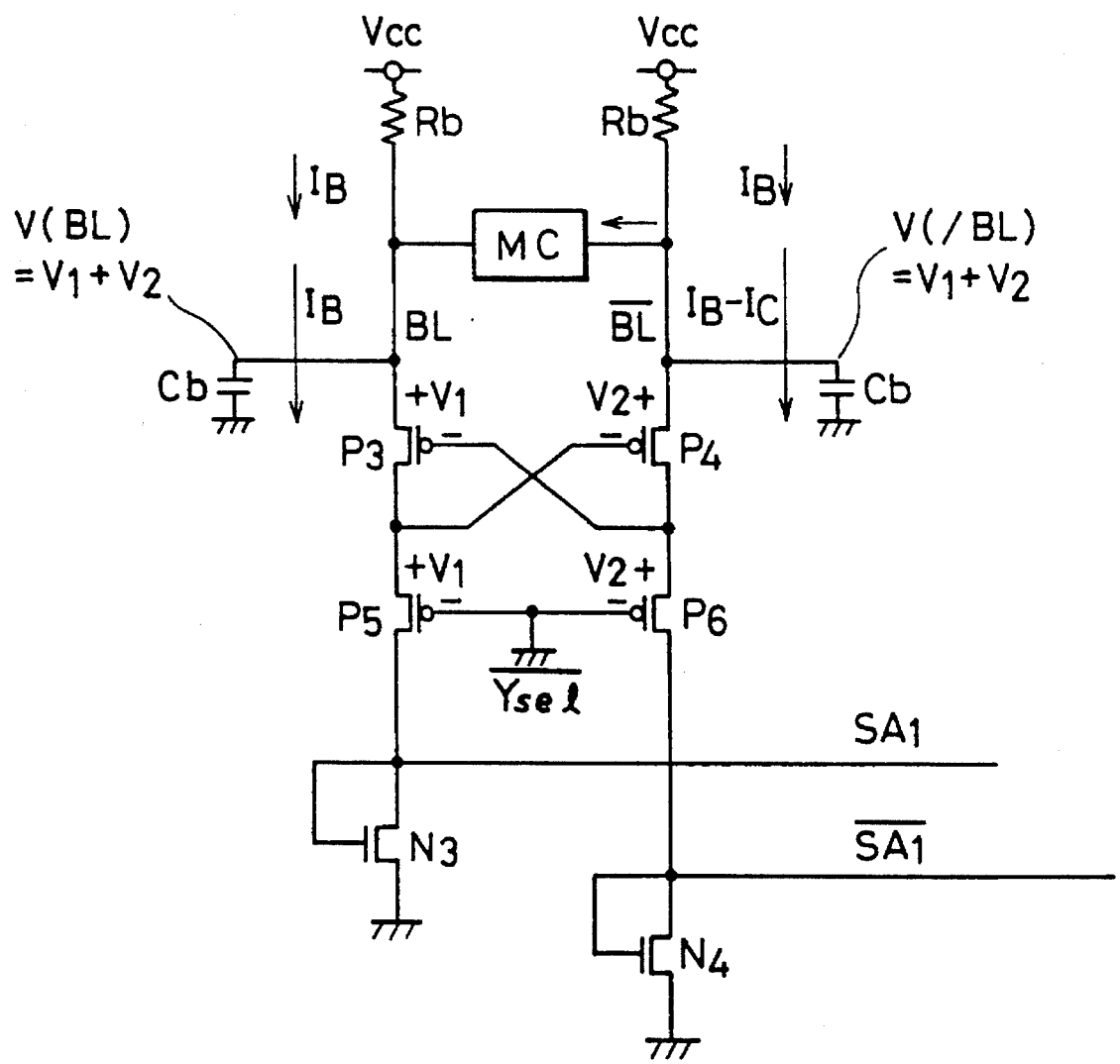
FIG. 4 is a diagram for explaining operation of the sense amplifier shown in FIG. 3.

Referring to FIG. 7, a sense amplifier SA10 of the SRAM according to the first embodiment of the present invention includes a differential amplifying portion SA10a, a current transferring portion SA10b, an ATD pulse generating circuit 10 for generating an ATD pulse in response to an address signal ADD, a precharge signal PC generating circuit 20 for generating a precharge signal PC in response to the ATD pulse, and a word line activation signal WLA generating circuit 22 for generating a word line activation signal WLA in response to the precharge signal PC. Since current transferring portion SA10b is the same as current transferring portion SA30b of conventional sense amplifier SA30 shown in FIG. 3, the same and corresponding components are labeled with the same reference characters as those of FIG. 3, and the detailed description thereof will not be repeated. Since the entire configuration of the SRAM is the same as that of SRAM 200 shown in FIG. 1 excluding the following differences, the description will not be repeated. ATD pulse generating circuit 10, precharge signal PC generating circuit 20, and word line activation signal WLA generating circuit 22 will be described later with reference to operation thereof.

Differential amplifying portion SA10a includes P channel MOS transistors P1 and P2, storing capacitors CM1 and CM2, switches S1 and S2, output nodes SA OUT and $\overline{\text{SA OUT}}$, and N channel MOS transistors N1 and N2. N channel MOS transistors N1 and N2, and N channel MOS transistors N3 and N4 of current transferring portion SA10b form current mirror circuits, respectively, similar to the case of conventional sense amplifier SA30 (cf. FIG. 3). P channel MOS transistor P1, capacitor CM1, and switch S1 form a dynamic current mirror circuit. P channel MOS transistor P2, capacitor CM2, and switch S2 form another dynamic current mirror circuit.

In detail, the drains of P channel MOS transistors P1 and P2 are connected to the drains of N channel MOS transistors N1 and N2 through output nodes SA OUT and $\overline{\text{SA OUT}}$, respectively. The sources of P channel MOS transistors P1 and P2 are connected to power supply potential Vcc. The sources of N channel MOS transistors N1 and N2 are grounded. Capacitors CM1 and CM2 are connected between the gates and the sources of P channel MOS transistors P1 and P2, respectively. Switches S1 and S2 are connected between the gates and the drains of P channel MOS transistors P1 and P2, respectively. It should be noted that switches S1 and S2 are formed of CMOS transfer gates TG, as specifically shown in FIG. 8.

Referring to FIG. 9, a dynamic current mirror circuit generally operates as follows. Operation of the dynamic current mirror circuit formed of P channel MOS transistor P1, capacitor CM1, and switch S1 shown in FIG. 7 will be described hereinafter.

Figure 9B:
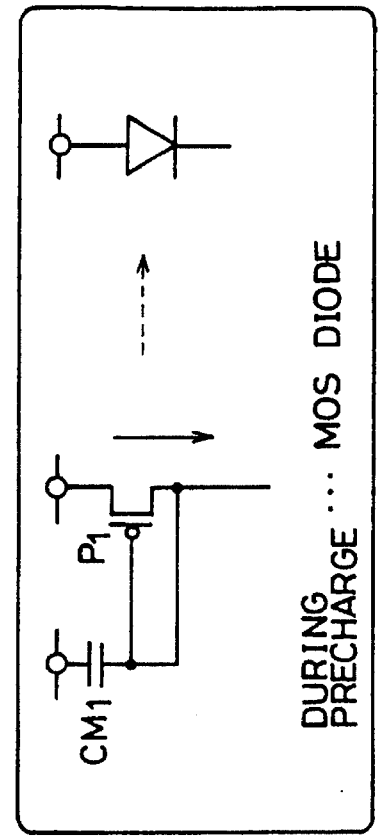
FIGS. 9(a)–9(c) is a diagram for explaining operation of a dynamic current mirror circuit of the sense amplifier shown in FIG. 7.

During a precharge period in which current values are stored, switch S1 is turned on to make capacitor CM1 store the gate voltage of P channel MOS transistor P1. The gate and the drain of P channel MOS transistor P1 attain the same potential. Therefore, as shown in FIG. 9B, P channel MOS transistor P1 shows characteristics just like a diode at this time. Upon completion of charging of capacitor CM1, switch S1 is turned off.

Figure 9C:
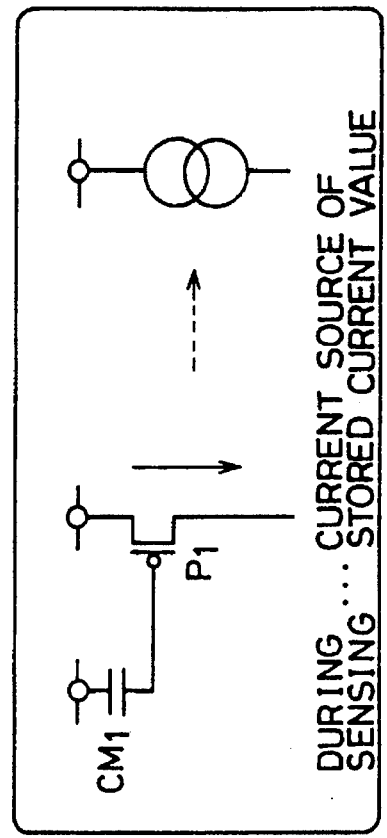

After the precharge period, a period in which a sensing signal is waited for is started. During this period, P channel MOS transistor P1 continues to make flow the current which was flowing through switch S1 when it was turned on. Since the output impedance of the drain is high at this time, P channel MOS transistor P1 shows characteristics just like a current source, as shown in FIG. 9C.

Figure 9A:
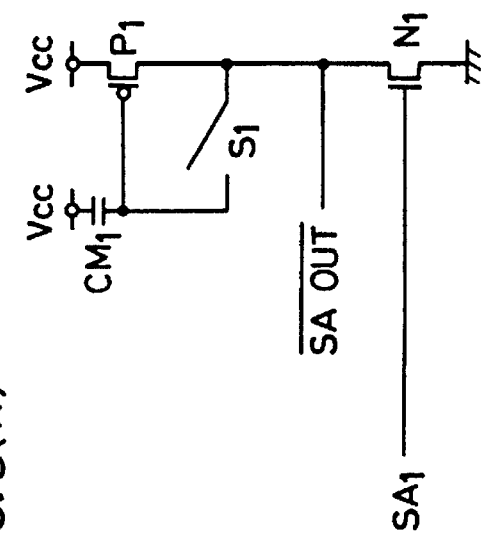

Another dynamic current mirror circuit formed of P channel MOS transistor P2, capacitor CM2, and switch S2 (cf. FIG. 7) operates similar to the circuit shown in FIG. 9A.

Figure 5:
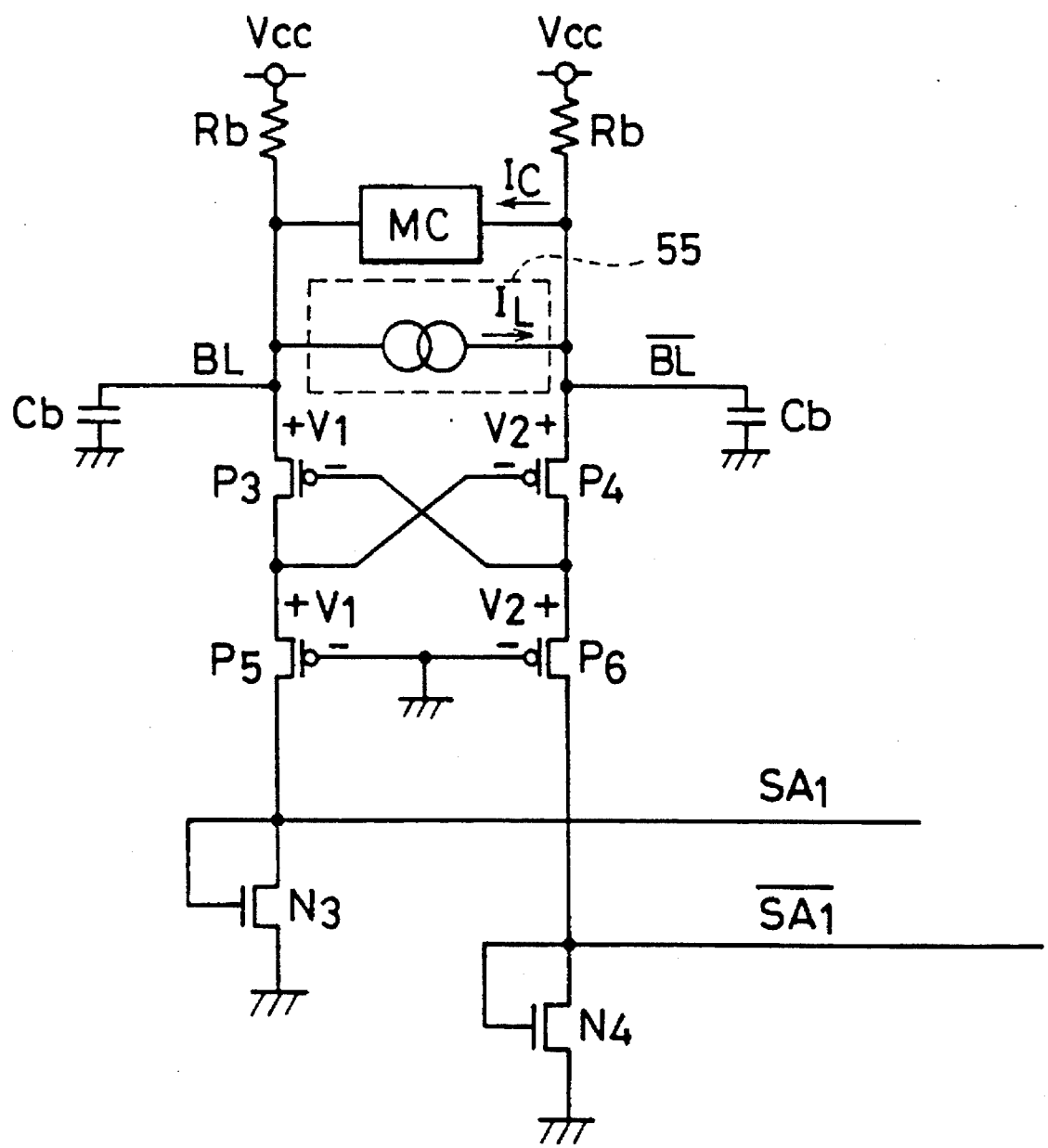
FIG. 5 is a diagram for explaining problems of the sense amplifier shown in FIG. 3.
Figure 6:
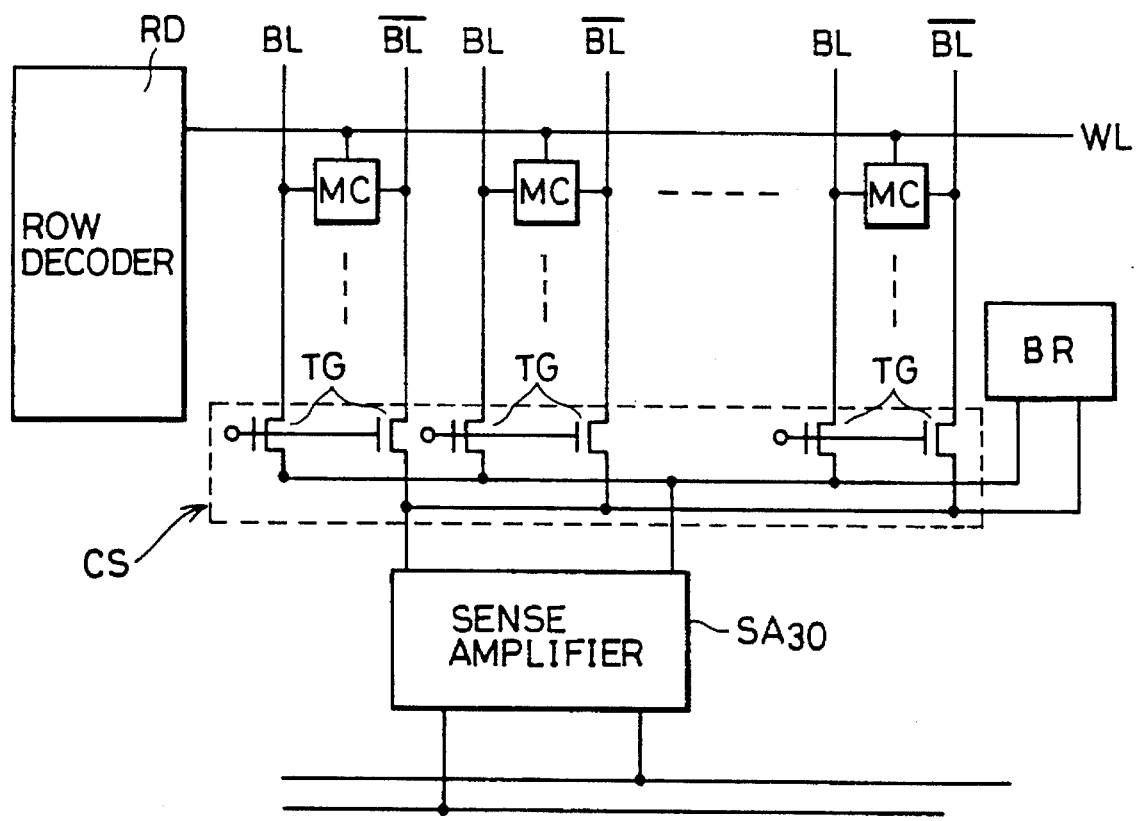
FIG. 6 is a block diagram showing a configuration of another conventional SRAM.

Taking the above into consideration, description will be given of sensing operation of sense amplifier SA10 shown in FIG. 7, with reference to FIG. 10. As described with reference to FIG. 5, assume that there is an offset in H reading from memory cell MC. A current flowing through transistors P2 and N2 corresponding to bit line $\overline{\text{BL}}$ at this time is larger than that flowing through transistors P1 and N1 corresponding to bit line BL. In FIG. 10, the number of arrows indicates the magnitude of a current flowing through a corresponding path.

Referring to FIGS. 10A and 7, capacitors CM1 and CM2 are precharged before accessing memory cell MC. More specifically, referring to FIG. 7, switches S1 and S2 are turned on to make capacitors CM1 and CM2 store the gate voltages of P channel MOS transistors P1 and P2, respectively.

When charging of capacitors CM1 and CM2 is completed, switches S1 and S2 are turned off. Then, P channel MOS transistors P1 and P2 continue to make flow the currents which were flowing through switches S1 and S2 when they were turned on, respectively, and operate just like current sources, as shown in FIG. 10B.

If H reading is carried out at this time, a current flowing through N channel MOS transistor N2 corresponding to bit line $\overline{\text{BL}}$ decreases as shown in FIG. 10C. However, since P channel MOS transistor P2 continues to make a current of the same magnitude as the current at the time of completion of precharge as described above, a difference current between the current flowing through transistor P2 and the current flowing through transistor N2 flows out of output node SA OUT, as shown in FIG. 10C, pulling up output node SA OUT to the high level. Since output nodes SA OUT and $\overline{\text{SA OUT}}$ at the time of reading are in a high impedance state, the gain of sense amplifier SA10 is large, and the amplitude of the output is large. Therefore, sense amplifier SA10 also serves as a level converting circuit.

As described above, a difference between the current which was flowing through transistor N2 before sensing, stored by the dynamic current mirror circuit, and the current flowing through transistor N2 during sensing can be sensed. Even if there is an offset in current transferring portion SA10b, the difference is independent of the offset. It can be alternatively considered that the offset, if any, is stored at the time of precharge, and that the offset is canceled at the time of sensing. Therefore, by using sense amplifier SA10 of this embodiment, data stored in a memory cell can be sensed at a high speed without being affected by the offset of current transferring portion SA10b. Since the output is not influenced by the offset, data can be sensed preferably even if the cell current $I_C$ is suppressed to a small value. Therefore, operation of the semiconductor memory device can be increased in speed, and power consumption can be suppressed.

Figure 11:
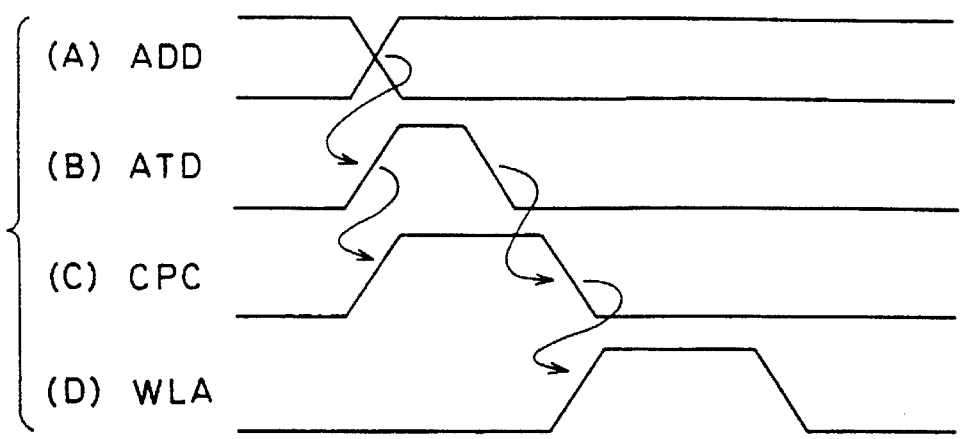
FIG. 11 is a timing chart showing control signals of the SRAM in which the sense amplifier shown in FIG. 7 is used.

FIG. 11 is a timing chart showing control signals of the SRAM of this embodiment. An ATD pulse (FIG. 11B) is obtained in response to a change of an input signal, for example, an address signal ADD (FIG. 11A), and a precharge signal PC (FIG. 11C) is obtained in response to the ATD pulse. Switches S1 and S2 of sense amplifier SA10 are controlled by precharge signal PC. In response to completion of precharge, that is, in response to the falling of precharge signal PC, for example, a word line activation signal WLA (FIG. 11D) is brought to the H level.

Referring again to FIG. 7, a circuit for implementing the control signals shown in the timing chart of FIG. 11 includes ATD pulse generating circuit 10 for generating an ATD pulse in response to address signal ADD, precharge signal PC generating circuit 20 for generating precharge signal PC in response to the ATD pulse, and word line activation signal WLA generating circuit 22 for generating word line activation signal WLA in response to precharge signal PC.

Figure 12:
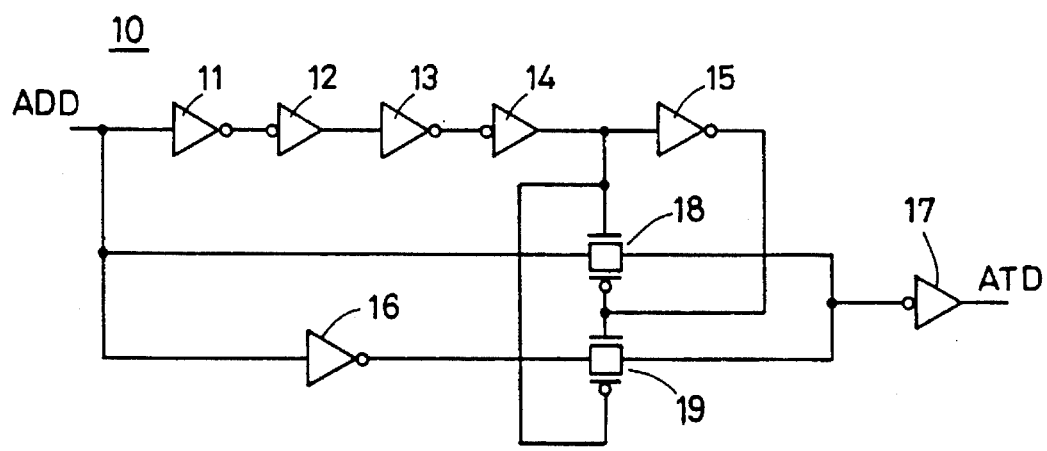
FIG. 12 is a circuit diagram showing a configuration of an ATD pulse generating circuit.

Referring to FIG. 12, ATD pulse generating circuit 10 includes inverters 11 to 17 and transfer gates 18 and 19 connected as shown in FIG. 12. Address signal ADD is applied to the gate of an N channel MOS transistor of transfer gate 18 and the gate of a P channel MOS transistor of transfer gate 19 through series-connected inverters 11 to 14. The output of inverter 14 is applied to the gate of a P channel MOS transistor of transfer gate 18 and the gate of an N channel MOS transistor of transfer gate 19 through inverter 15. Therefore, only one of transfer gates 18 and 19 is turned on at one time. Address signal ADD is applied to inverter 17 through transfer gate 18, or inverter 16 and transfer gate 19. Inverter 17 provides an ATD pulse.

Consider the case where address signal ADD is at the L level, for example. Transfer gate 19 is turned on. The output of inverter 17 is at the L level. When address signal ADD changes to the H level, the output of inverter 17 attains the H level. Then, delayed by a delay time of inverters 11 to 15, transfer gate 18 is turned on, and the output of inverter 17 attains the L level.

Figure 13:
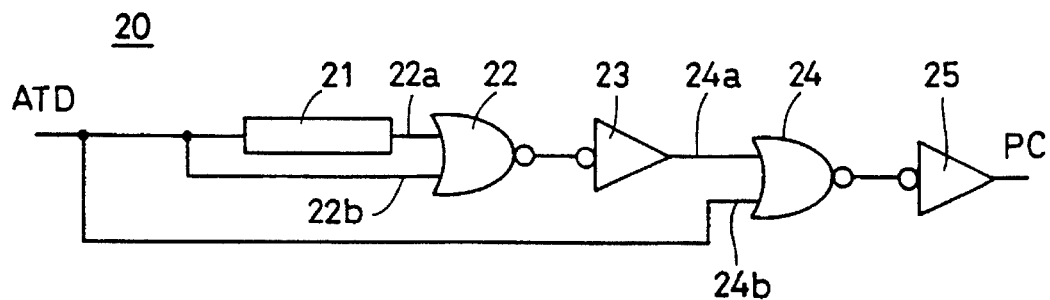
FIG. 13 is a circuit diagram showing a configuration of a precharge signal PC generating circuit.

Referring to FIG. 13, precharge signal generating circuit 20 includes a delay circuit 21, NOR gates 22 and 24, and inverters 23 and 25, connected as shown in FIG. 13. The ATD pulse is applied to one input node 22a of NOR gate 22 through delay circuit 21. The ATD pulse is also applied to the other input node 22b of NOR gate 22. The output of NOR gate 22 is applied to one input node 24a of NOR gate 24 through inverter 23. The ATD pulse is applied to the other input node 24b of NOR gate 24. The output of NOR gate 24 is applied to inverter 25. The output of inverter 25 is precharge signal PC. It should be noted that delay circuit 21 is formed of a capacitor or inverters connected in an even number of stages.

In operation, when the ATD pulse is at the L level, the output of inverter 25 is also at the L level. Assume that the output of NOR gate 22 is at the H level. When the ATD pulse rises to the H level, the other input node 24b of NOR gate 24 attains the H level independent of the input at one input node 24a, and the output of inverter 25 attains the H level. The output of NOR gate 22 attains the L level, and the output of inverter 23 attains the H level. Delayed by a delay time of delay circuit 21, one input node 24a of NOR gate 24 attains the H level, and the output of NOR gate 24 attains the L level.

Then, the ATD pulse falls to the L level. Although the other input node 24b of NOR gate 24 attains the L level, the output of NOR gate 24 is still at the L level, since one input node 24a still remains the H level. The output of inverter 25 still remains the H level. When one input node 24a of NOR gate 24 attains the L level delayed by a delay time of delay circuit 21, the output of inverter 25 also attains the L level. Therefore, delayed from the ATD pulse by a delay time of delay circuit 21, precharge signal PC falls.

Figure 14:
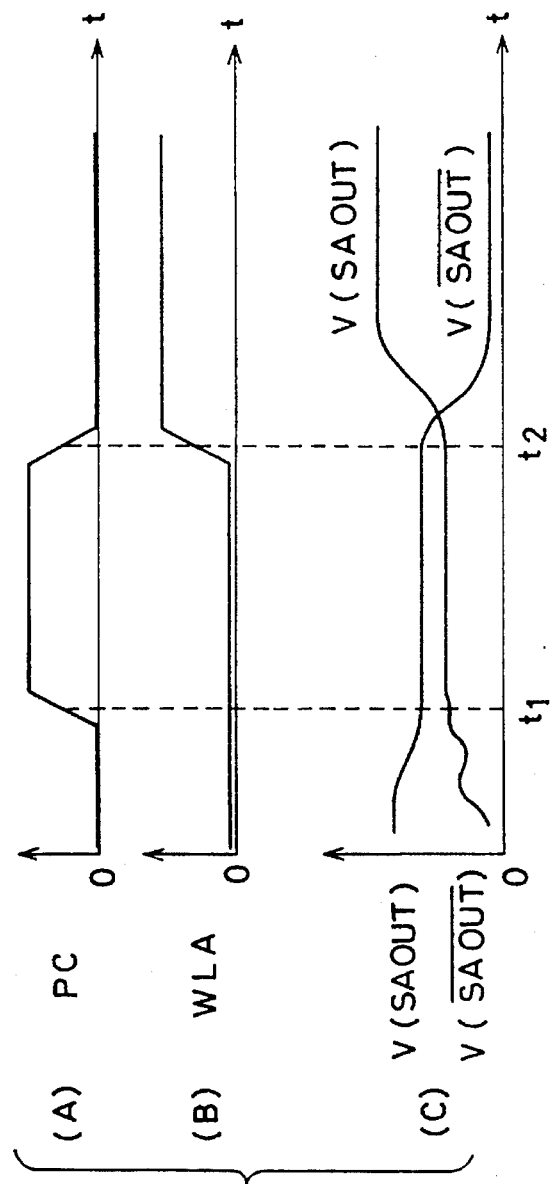
FIG. 14 is a timing chart showing outputs of the sense amplifier shown in FIG. 7.

FIG. 14 is a timing chart showing precharge signal PC, word line activation signal WLA, and potentials V (SA OUT) and V ($\overline{\text{SA OUT}}$) of output nodes of sense amplifier SA10. Upon rising of precharge signal PC at a time t1, precharge is started. Simultaneously with completion of precharge and falling of precharge signal PC at a time t2, word line activation signal WLA rises, and memory cell MC is activated. Accordingly, the potential V (SA OUT) rises.

[Second Embodiment]

Figure 15:
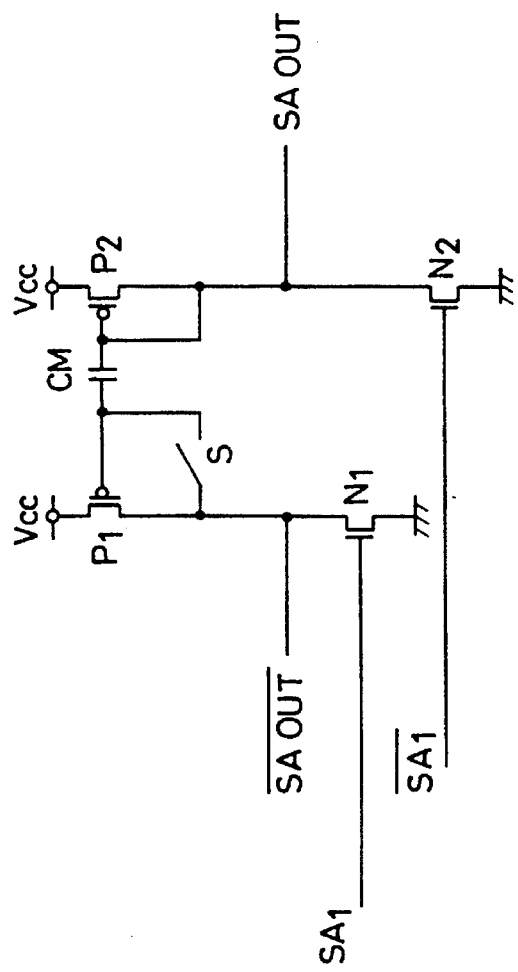
FIG. 15 is a circuit diagram showing a configuration of a differential amplifying portion of a sense amplifier of an SRAM according to a second embodiment of the present invention.

FIG. 15 is a circuit diagram showing a configuration of a differential amplifying portion SA20a of a sense amplifier SA20 of the SRAM according to the second embodiment of the present invention. Since a current transferring portion is the same as current transferring portion SA30b of conventional sense amplifier SA30 shown in FIG. 3, the same and corresponding components are labeled with the same reference characters, and the detailed description thereof will not be repeated. Since the entire configuration of the SRAM is the same as that of SRAM 200 shown in FIG. 1, the description will not be repeated.

Differential amplifying portion SA20a includes P channel MOS transistors P1 and P2, capacitor CM, switch S, and N channel MOS transistors N1 and N2. The drains of P channel MOS transistors P1 and P2 and the drains of N channel MOS transistors N1 and N2 are connected to each other through output nodes SA OUT and $\overline{\text{SA OUT}}$, respectively. The sources of P channel MOS transistors P1 and P2 are both connected to power supply potential Vcc. The sources of N channel MOS transistors N1 and N2 are grounded. Capacitor CM is connected between the gates of P channel MOS transistors P1 and P2. Switch S is connected between the gate and the drain of P channel MOS transistor P1.

Figure 16:
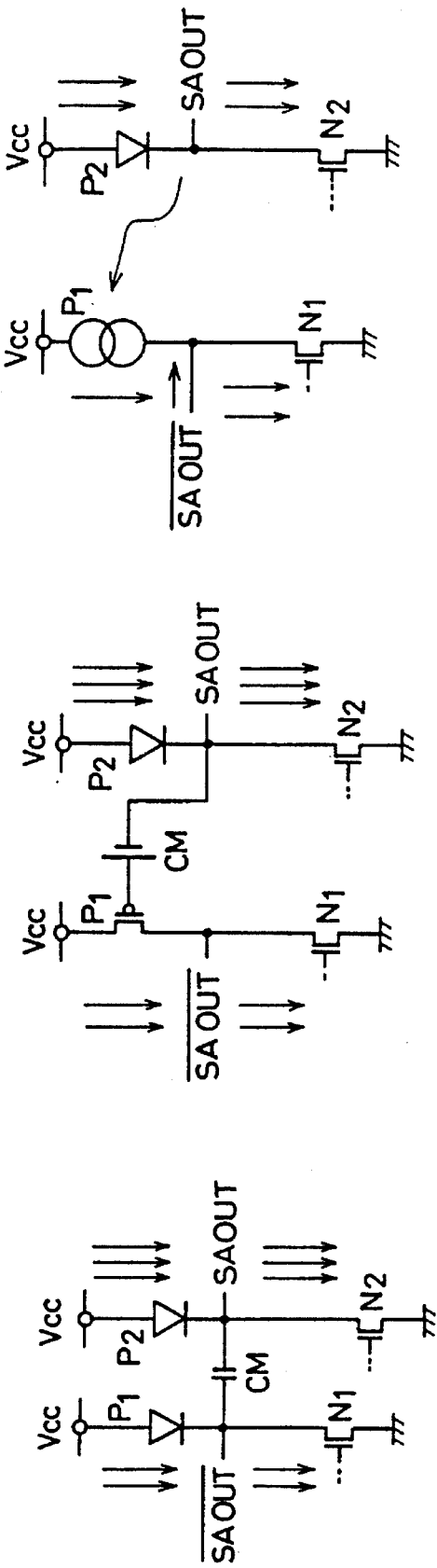
FIGS. 16(a)–16(c) is a diagram for explaining operation of the sense amplifier shown in FIG. 15.

FIG. 16 is a diagram for explaining operation of differential amplifying portion SA20a of the sense amplifier shown in FIG. 15. It is assumed that there is an offset in H reading from memory cell MC, and that a current flowing through transistors P2 and N2 corresponding to bit line $\overline{\text{BL}}$ is larger than a current flowing through transistors P1 and N1 corresponding to bit line BL. In FIG. 16, the number of arrows indicates the magnitude of a current flowing through a corresponding path.

FIG. 16A shows the state of sense amplifier SA20 of the second embodiment during a precharge period. In the precharge period, switch S is turned on to make capacitor CM store a difference between the gate voltages of P channel MOS transistors P1 and P2.

When charging of capacitor CM is completed, switch S is turned off. Then, as shown in FIG. 16B, capacitor CM serves as a voltage source which stores a gate voltage difference between P channel MOS transistors P1 and P2 during the precharge period. Therefore, the difference between the currents flowing through P channel MOS transistors P1 and P2 keeps the level during the precharge period. P channel MOS transistor P1 operates just like a current source, and P channel MOS transistor P2 operates just like a diode.

If H reading is carried out at this time, the current flowing through N channel MOS transistor N2 corresponding to bit line $\overline{\text{BL}}$ decreases as shown in FIG. 16C. At the same time, the current flowing through P channel MOS transistor P2 also decreases by the same amount. Capacitor CM stores the difference between the current flowing through P channel MOS transistor P1 and the current flowing through P channel MOS transistor P2, as described above. The current flowing through P channel MOS transistor P1 decreases by the same amount as the amount of decrease of the current flowing through P channel MOS transistor P2. Therefore, a current equal to the difference between the currents flowing through P channel MOS transistor P1 and N channel MOS transistor N1 flows into node $\overline{\text{SA OUT}}$, pulling down node $\overline{\text{SA OUT}}$ to the low level. Since node $\overline{\text{SA OUT}}$ is in a high impedance state, the gain of an obtained signal is large. In addition, since the amplitude is large, the sense amplifier also serves as a level converting circuit.

In this embodiment, an amount of change of the magnitude of a current flowing through the dynamic current mirror circuit from a current corresponding to a voltage difference stored in the capacitor can be sensed. This amount of change can be sensed independent of the offset in the current transferring portion of the sense amplifier. It is also possible to suppress the cell current $I_C$ to a small value, implementing high speed sensing. In addition, although two sets of capacitors for storing the offset and switches are required in the first embodiment, only one set is required in this second embodiment. Therefore, it is possible to reduce the number of components as compared to the first embodiment, making it possible to decrease an area occupied by the circuit.

Figure 17:
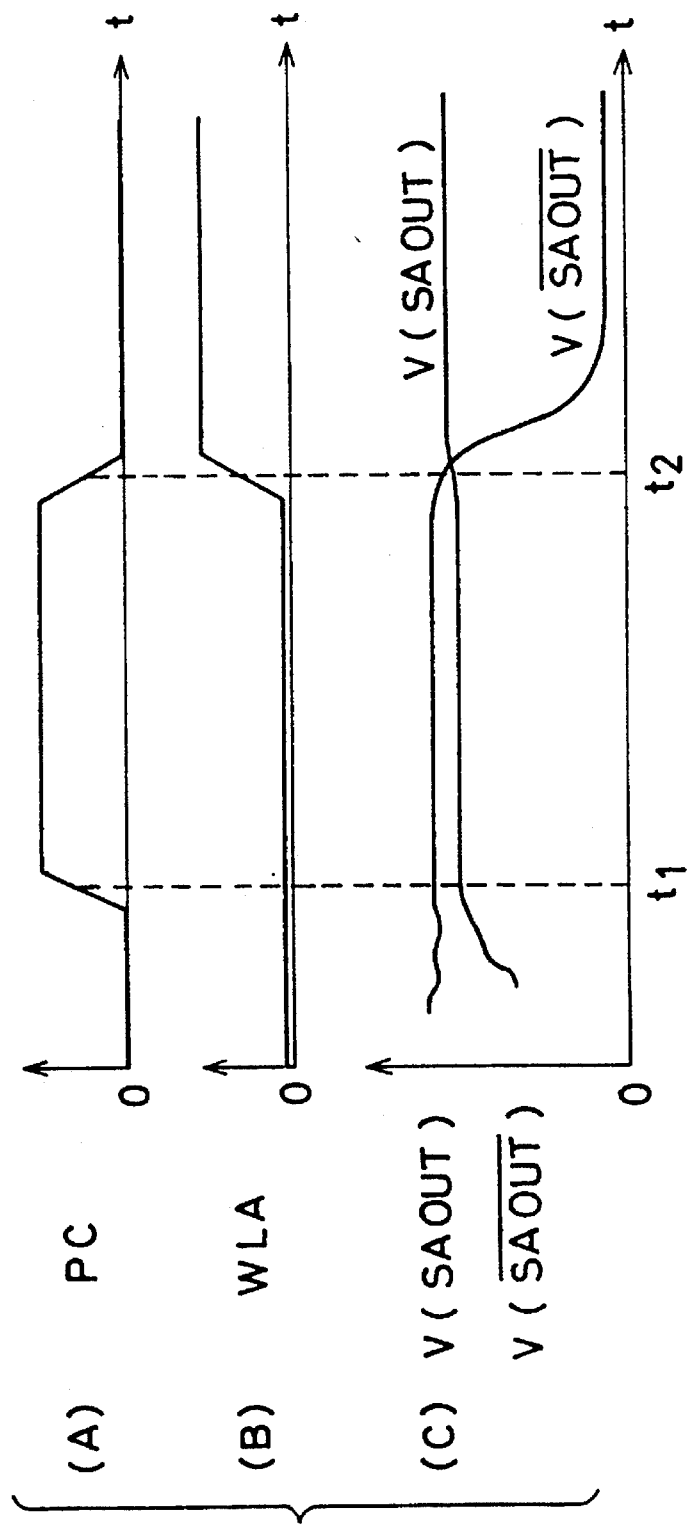
FIG. 17 is a timing chart showing outputs of the sense amplifier shown in FIG. 15.

FIG. 17 is a timing chart showing precharge signal PC (FIG. 17A), word line activation signal WLA (FIG. 17B), potentials V (SA OUT) and V ($\overline{\text{SA OUT}}$) of output nodes (FIG. 17C). When precharge signal PC rises at time t1, precharge of capacitor CM is started. When precharge is completed and precharge signal PC falls at time t2, word line activation signal WLA rises simultaneously, and memory cell MC is activated. Accordingly, output node $\overline{\text{SA OUT}}$ is pulled down.

[Third Embodiment]

Figure 18:
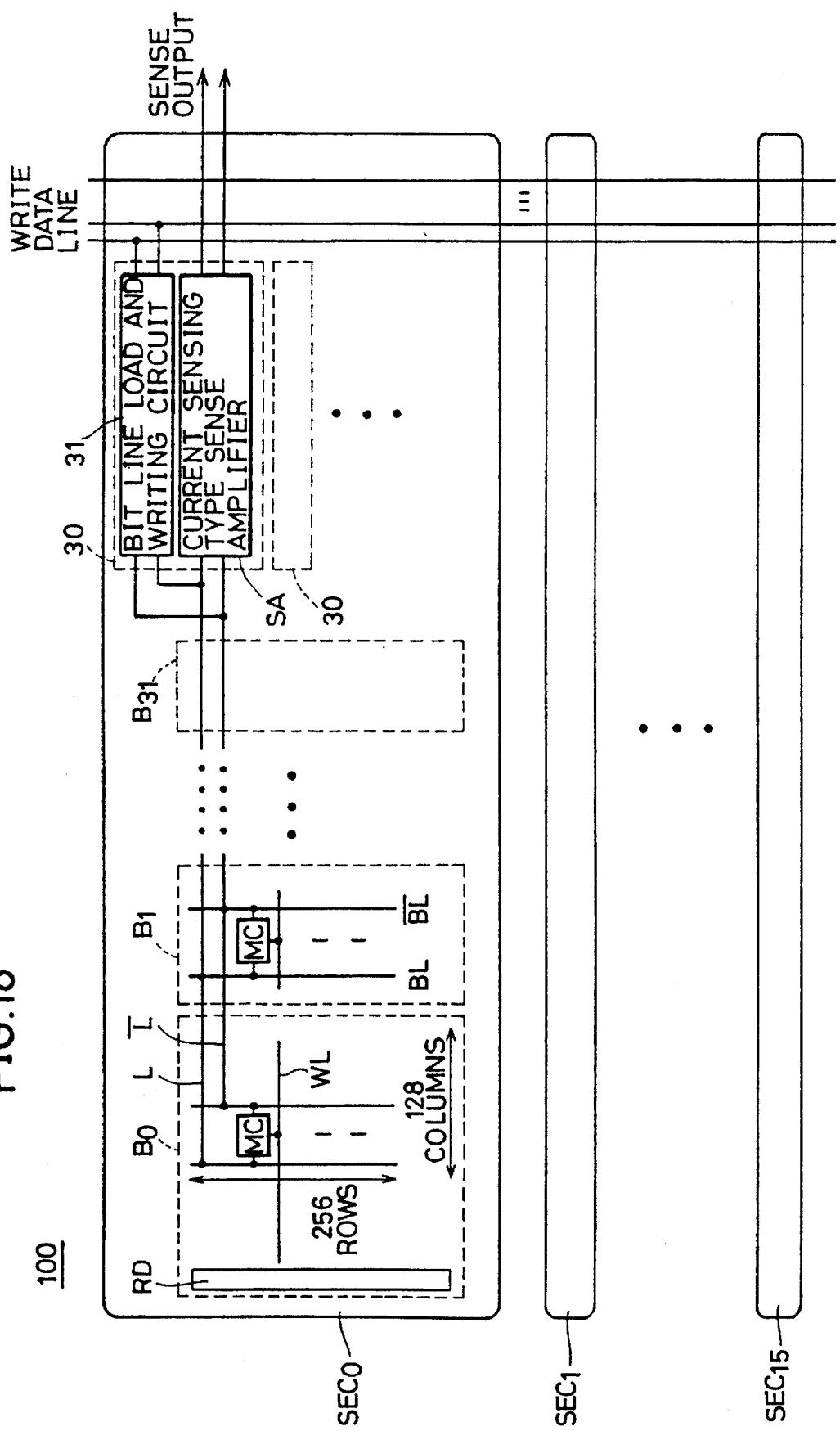
FIG. 18 is a block diagram showing a configuration of an SRAM according to a third embodiment of the present invention.

FIG. 18 is a block diagram showing a configuration of an SRAM 100 according to the third embodiment of the present invention. SRAM 100 is an improvement of the invention disclosed in a commonly assigned Japanese patent application entitled "Semiconductor Memory Device", laid open on Aug. 18, 1994 as Japanese Patent Laying-Open No. 4-228188. Japanese Patent Laying-Open No. 4-228188 is a counterpart of U.S. Pat. No. 5,280,441 issued on Jan. 18, 1994. U.S. Pat. No. 5,280,441 is incorporated herein by reference in its entirety.

Referring to FIG. 18, SRAM 100 includes 16 sections SEC0 to SEC15 each having a capacity of 1M bit.

Sections SEC0 to SEC15 each include 32 blocks B0 to B31 arranged in the column direction, 128 bit line peripheral circuits 30 arranged in the row direction at the ends of the blocks (the right end in FIG. 18), and 128 bit line signal input/output line pairs L and $\overline{\text{L}}$ connecting blocks B0 to B31 and bit line peripheral circuits 30.

Blocks B0 to B31 each include memory cells MC arranged in a matrix of 256 rows and 128 columns, a plurality of word lines WL provided corresponding to the rows, and a plurality of bit line pairs BL and $\overline{\text{BL}}$ provided corresponding to the columns, and a row decoder RD provided at the ends of the word lines WL (the left end in FIG. 18).

Each bit line peripheral circuit 30 includes a bit line load and writing circuit 31 and a current sensing type sense amplifier SA. Sense amplifier SA is sense amplifier SA10 according to the first embodiment of the present invention, or sense amplifier SA20 according to the second embodiment of the present invention.

Bit line pairs BL and $\overline{\text{BL}}$ in the same columns of the blocks B0 to B31 are connected together to bit line signal input/output line pair L and $\overline{\text{L}}$ corresponding to the columns, and connected to bit line peripheral circuit 30 for the columns through the bit line signal input/output signal line pair L and $\overline{\text{L}}$. More specifically, 32 bit line pairs BL and $\overline{\text{BL}}$ are connected to one bit line signal input/output line pair L and $\overline{\text{L}}$. Since 256 memory cells MC are connected to one bit line pair BL and $\overline{\text{BL}}$, 256×32=8192 memory cells MC are connected to one bit line signal input/output line pair L and $\overline{\text{L}}$.

Bit line pair BL and $\overline{\text{BL}}$ is formed in the first interconnection layer, and bit line signal input/output line pair L nd $\overline{\text{L}}$ is formed in the second interconnection layer. Bit line signal input/output line pair L and $\overline{\text{L}}$ is arranged on a memory cell array in parallel with shunt-connected word lines WL.

Figure 19:
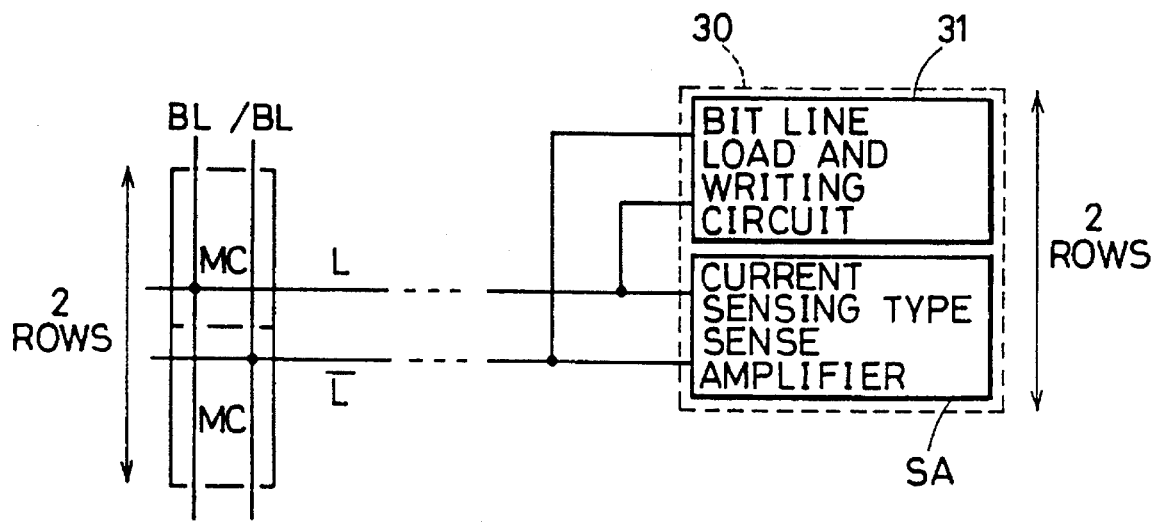
FIG. 19 is a diagram for explaining a difference between pitches of a bit line pair BL and $\overline{BL}$ and a bit line signal input/output line pair L and $\overline{L}$ of the SRAM shown in FIG. 18.
Figure 20:
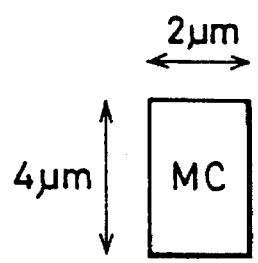
FIG. 20 is a diagram showing the dimension of a memory cell of the SRAM shown in FIG. 18.

In this embodiment, each of blocks B0 to B31 includes 256 rows and 128 columns of memory cells. Therefore, as shown in FIG. 19, bit line signal input/output line pair L and $\overline{\text{L}}$ is connected to bit lines BL and $\overline{\text{BL}}$ for every 256/128= 2 rows. As shown in FIG. 20, the dimension of memory cell MC in the row direction is generally set larger than the dimension of memory cell MC in the column direction (in the figure, four microns in the row direction, and two microns in the column direction). Assuming that the dimension in the row direction is four microns and the dimension in the column direction is two microns, the pitch of bit line signal input/output line pair L and $\overline{\text{L}}$ is (256/128)·(4/2)= 4 times the pitch of bit line pair BL and $\overline{\text{BL}}$. It is easier in general to manufacture a larger pitch of interconnection. Therefore, as compared to the conventional technique in which bit line peripheral circuits 30 were provided at the ends of bit line pairs BL and $\overline{\text{BL}}$, the present invention can arrange bit line peripheral circuits 30 more easily.

Assuming that the number of memory cells MC connected to bit line peripheral circuit 30 is the same, the present invention further includes the following advantage over the conventional technique. Conventionally, 32 bit line pairs BL and $\overline{\text{BL}}$ were series-connected to bit line peripheral circuit 30. In this third embodiment, 32 bit line pairs BL and $\overline{\text{BL}}$ are connected in parallel with one bit line signal input/output line pair L and $\overline{\text{L}}$, which is connected to bit line peripheral circuit 30. Therefore, although parasitic capacitance Cb of bit line pair BL and $\overline{\text{BL}}$ is large, parasitic resistance Rb of bit lines BL and $\overline{\text{BL}}$ is small. Therefore, the present invention is suitable for a current sensing technique.

More specifically, it is assumed that the length of memory cell MC in the row direction is four microns, and that the length of memory cell MC in the column direction is two microns as shown in FIG. 20, for example. The length of a memory cell array of each of blocks B0 to B31 in the row direction is 256·4 microns= 1024 microns, and the length in the column direction is 128·2 microns= 256 microns. As shown in FIG. 18, bit line signal input/output line pair L and $\overline{\text{L}}$ crosses over 32 blocks B0 to B31. The length of bit line signal input/output line pair L and $\overline{\text{L}}$ becomes 256 microns·32= 8192 microns. Therefore, the length of interconnection from bit line peripheral circuit 30 arranged at the end (the right end in FIG. 18) to the farthermost memory cell MC (the left end in FIG. 18) is 8192+ 1024= 9216 microns.

On the other hand, in the conventional case where 32 bit line pairs BL and $\overline{\text{BL}}$ are connected in series, the length of interconnection becomes 1024 microns×32=32768 microns, which is four times of the length of interconnection of this embodiment.

As described above, in the semiconductor memory device according to the present invention, a sense amplifier stores a current $I_1$ flowing through one bit line before activation of a memory cell. When the memory cell is activated, the sense amplifier provides a difference current $I_C$ between the current $I_1$ and a current $I_1-I_C$ flowing through the other bit line. Therefore, the sense amplifier can detect a cell current $I_C$ independent of an offset current $I_L$ between one bit line and the other bit line, resulting in precise reading of a binary signal of the memory cell.

In the present invention, bit line signal input/output line pairs are provided crossing bit line pairs. By connecting the bit line signal input/output line pairs to sense amplifiers, arrangement of sense amplifiers is facilitated as compared to the conventional case where sense amplifiers can be arranged only at either or both ends of bit line pairs.

In the present invention, bit line signal input/output lines common to a plurality of memory cell arrays are provided. Corresponding bit line pairs of the memory cell arrays are connected together to the common bit line signal input/output line pair. The bit line signal input/output line pairs are connected to the sense amplifiers. As compared to the conventional case where corresponding bit line pairs of the memory cell arrays are series-connected, the parasitic resistance of the bit line pairs becomes smaller in the present invention.

In the semiconductor memory device according to the present invention, the sense amplifier stores the offset current $I_L$ between one bit line and the other bit line before activation of a memory cell. When the memory cell is activated, a difference current $I_C$ between one bit line and the other bit line is provided from the sense amplifier after correction of the amount of the offset current $I_L$. Therefore, the cell current $I_C$ can be detected independent of the offset current $I_L$ between one bit line and the other bit line, and a binary signal of the memory cell can be read out precisely.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a plurality of memory cells arranged in a plurality of rows and columns;

a plurality of word lines provided corresponding to memory cell rows;

a plurality of bit line pairs provided corresponding to memory cell columns; and a plurality of sense amplifiers provided corresponding to said plurality of bit line pairs for amplifying a current change which occurs in a corresponding bit line pair in accordance with a binary signal stored in a memory cell activated by a corresponding one of said word lines, wherein said sense amplifiers each includes first and second current mirror means for generating currents of the magnitudes respectively corresponding to currents flowing through a corresponding one of said bit line pairs, storing means, responsive to a signal selecting said memory cell, for storing an amount associated with the currents generated by said first and second current mirror means before activation of said memory cell, and current supplying means, responsive to activation of said memory cell and based on said amount stored in said storing means, for supplying, to said first and second current mirror means, currents having a predetermined relationship with the currents having been generated by said first and second current mirror means before activation of said memory cell, whereby a current change corresponding to data stored in said selected memory cell occurs in a connection node between said first current mirror means and said current supplying means, or in a connection node between said second current mirror means and said current supplying means.

2. The semiconductor memory device as recited in claim 1, further comprising means, responsive to said signal selecting said memory cell, for generating and applying to said storing means a timing signal defining a timing at which said amount is stored in said storing means.

3. The semiconductor memory device as recited in claim 2, wherein said storing means includes first and second current storing means for storing the currents flowing through said first and second current mirror means, respectively.

4. The semiconductor memory device as recited in claim 3, wherein said current supplying means includes
      a first transistor having one terminal connected to power supply potential and the other terminal connected to an input of said first current mirror means, and
      a second transistor having one terminal connected to power supply potential and the other terminal connected to an input of said second current mirror means,
   said first current storing means includes
      a first capacitive element having one terminal connected to a gate electrode of said first transistor and the other terminal connected to said power supply potential, and
      first connecting means responsive to said timing signal for operatively connecting said gate electrode of said first transistor and a connection node between said first transistor and said first current mirror means, and
   said second current storing means includes
      a second capacitive element having one terminal connected to a gate electrode of said second transistor and the other terminal connected to said power supply potential, and
      second connecting means responsive to said timing signal for operatively connecting said gate electrode of said second transistor and a connection node between said second transistor and said second current mirror means.

5. The semiconductor memory device as recited in claim 2, wherein said storing means includes difference current storing means for storing a difference between currents flowing through said first and second current mirror means.

6. The semiconductor memory device as recited in claim 5, wherein said current supplying means includes
      a first transistor having one terminal connected to power supply potential and the other terminal connected to an input of said first current mirror means, and
      a second transistor having one terminal connected to power supply potential and the other terminal connected to an input of said second current mirror means, a gate electrode of said second transistor being also connected to said other terminal of said second transistor,
   said difference current storing means includes
      a capacitive element having one terminal connected to a gate electrode of said first transistor and the other terminal connected to said gate electrode of said second transistor, and
      connecting means responsive to said timing signal for operatively connecting said gate electrode of said first transistor and a connection node between said first transistor and said first current mirror means.

7. A semiconductor memory device, comprising:

a memory cell array including a plurality of memory cells arranged in a plurality of rows and columns;

a plurality of word lines provided corresponding to memory cell rows;

a plurality of bit line pairs provided corresponding to memory cell columns;

a plurality of input/output line pairs provided crossing said plurality of bit line pairs and corresponding to said plurality of bit line pairs and connected to a corresponding one of said plurality of bit line pairs, and a plurality of sense amplifiers provided corresponding to said plurality of input/output line pairs for amplifying current changes which occur in a corresponding bit line pair and a corresponding input/output line pair in accordance with a binary signal stored in a memory cell activated by a corresponding one of said word lines, wherein said sense amplifiers each includes first and second current mirror means for generating currents of the magnitudes respectively corresponding to currents flowing through corresponding said input/output line pairs, storing means, responsive to a signal selecting said memory cell, for storing an amount associated with the currents generated by said first and second current mirror means before activation of said memory cell, and current supplying means, responsive to activation of said memory cell and based on said amount stored in said storing means, for supplying, to said first and second current mirror means, currents having a predetermined relationship with the currents having been generated by said first and second current mirror means before activation of said memory cell, whereby a current change corresponding to data stored in said selected memory cell occurs in a connection node between said first current mirror means and said current supplying means, or in a connection node between said second current mirror means and said current supplying means.

8. The semiconductor memory device as recited in claim 7, further comprising means, responsive to said signal selecting said memory cell, for generating and applying to said storing means a timing signal defining a timing at which said amount is stored in said storing means.

9. The semiconductor memory device as recited in claim 8, wherein said storing means includes first and second current storing means for storing the currents flowing through said first and second current mirror means, respectively.

10. The semiconductor memory device as recited in claim 9, wherein said current supplying means includes a first transistor having one terminal connected to power supply potential and the other terminal connected to an input of said first current mirror means, and a second transistor having one terminal connected to power supply potential and the other terminal connected to an input of said second current mirror means, said first current storing means includes a first capacitive element having one terminal connected to a gate electrode of said first transistor and the other terminal connected to said power supply potential, and first connecting means responsive to said timing signal for operatively connecting said gate electrode of said first transistor and a connection node between said first transistor and said first current mirror means, and said second current storing means includes a second capacitive element having one terminal connected to a gate electrode of said second transistor and the other terminal connected to said power supply potential, and second connecting means responsive to said timing signal for operatively connecting said gate electrode of said second transistor and a connection node between said second transistor and said second current mirror means.

11. The semiconductor memory device as recited in claim 8, wherein said storing means includes difference current storing means for storing a difference between the currents flowing through said first and second current mirror means.

12. The semiconductor memory device as recited in claim 11, wherein said current supplying means includes a first transistor having one terminal connected to power supply potential and the other terminal connected to an input of said first current mirror means, and a second transistor having one terminal connected to power supply potential and the other terminal connected to an input of said second current mirror means, a gate electrode of said second transistor being also connected to said other terminal of said second transistor, said difference current storing means includes a capacitive element having one terminal connected to a gate electrode of said first transistor and the other terminal connected to said gate electrode of said second transistor, and connecting means responsive to said timing signal for operatively connecting said gate electrode of said first transistor and a connection node between said first transistor and said first current mirror means.

13. The semiconductor memory device as recited in claim 7, comprising a plurality of said memory cell arrays, wherein said plurality of input/output line pairs are provided corresponding to a plurality of bit line pairs included in one memory cell array, and connected to respective corresponding ones of said plurality of bit line pairs of each of said plurality of memory cell arrays.

14. The semiconductor memory device as recited in claim 13, further comprising means responsive to said signal selecting said memory cell for generating and applying to said storing means a timing signal defining a timing at which said amount is stored in said storing means.

15. The semiconductor memory device as recited in claim 14, wherein said storing means includes first and second current storing means for storing the currents flowing through said first and second current mirror means, respectively.

16. The semiconductor memory device as recited in claim 15, wherein said current supplying means includes a first transistor having one terminal connected to power supply potential and the other terminal connected to an input of said first current mirror means, and a second transistor having one terminal connected to power supply potential and the other terminal connected to an input of said second current mirror means, said first current storing means includes
- a first capacitive element having one terminal connected to a gate electrode of said first transistor and the other terminal connected to said power supply potential, and
- first connecting means responsive to said timing signal for operatively connecting said gate electrode of said first transistor and a connection node between said first transistor and said first current mirror means, and said second current storing means includes
- a second capacitive element having one terminal connected to a gate electrode of said second transistor and the other terminal connected to said power supply potential, and
- second connecting means responsive to said timing signal for operatively connecting said gate electrode of said second transistor and a connection node between said second transistor and said second current mirror means.

17. The semiconductor memory device as recited in claim 13, wherein
said storing means includes difference current storing means for storing a difference between the currents flowing through said first and second current mirror means.

18. The semiconductor memory device as recited in claim 17, wherein
said current supplying means includes
- a first transistor having one terminal connected to power supply potential and the other terminal connected to an input of said first current mirror means, and
- a second transistor having one terminal connected to power supply potential and the other terminal connected to an input of said second current mirror means, a gate electrode of said second transistor being also connected to said other terminal of said second transistor, and said difference current storing means includes
- a capacitive element having one terminal connected to a gate electrode of said first transistor and the other terminal connected to said gate electrode of said second transistor, and
- connecting means responsive to said timing signal for operatively connecting said gate electrode of said first transistor and a connection node between said first transistor and said first current mirror means.

* * * * *